(12) United States Patent
Bohlländer (10) Patent No.: US 11,525,867 B2
(45) Date of Patent: Dec. 13, 2022

(54) IDENTIFICATION OF A PHASE-TO-GROUND INVERTER SHORT CIRCUIT

(71) Applicant: Marco Bohlländer, Hirschaid (DE)

(72) Inventor: Marco Bohlländer, Hirschaid (DE)

(73) Assignee: Rolls-Royce Deutschland Ltd & Co KG, Blankenfelde-Mahlow (DE)

( * ) Notice: Subject to any disclaimer, the term of this patent is extended or adjusted under 35 U.S.C. 154(b) by 197 days.

(21) Appl. No.: 17/094,010

(22) Filed: Nov. 10, 2020

(65) Prior Publication Data
US 2021/0148990 A1    May 20, 2021

(30) Foreign Application Priority Data
Nov. 18, 2019 (DE) .......................... 102019217748.4

(51) Int. Cl.
*G01R 31/42* (2006.01)
*G01R 31/52* (2020.01)
(Continued)

(52) U.S. Cl.
CPC .............. *G01R 31/42* (2013.01); *G01R 31/52* (2020.01); *H02M 1/32* (2013.01); *H02M 7/44* (2013.01)

(58) Field of Classification Search
CPC ...... G01R 31/00; G01R 31/08; G01R 31/083; G01R 31/086; G01R 31/42; G01R 31/50; G01R 31/52; G01R 19/1658; G01R 19/16566; G01R 19/16571; G01R 19/16576; H02M 1/0009; H02M 1/0029; H02M 1/32; H02M 1/325; H02M 1/36; H02M 7/42; H02M 7/44; H02M 7/48;
(Continued)

(56) References Cited

U.S. PATENT DOCUMENTS

| 2011/0234126 A1* | 9/2011 | Meyer, III | .......... H02P 29/0241 |
| | | | 318/400.3 |
| 2011/0241590 A1* | 10/2011 | Horikoshi | ............ H02H 7/0838 |
| | | | 318/490 |
| 2014/0132278 A1* | 5/2014 | Tang | ...................... G01R 31/52 |
| | | | 324/509 |

FOREIGN PATENT DOCUMENTS

DE    102010030079 A1    12/2011
WO    2019020316 A1    1/2019

OTHER PUBLICATIONS

German Search Report for German Application No. 10 2019 217 748.4 dated Feb. 27, 2020.

\* cited by examiner

*Primary Examiner* — Scott Bauer
*Assistant Examiner* — Carlos O Rivera-Perez
(74) *Attorney, Agent, or Firm* — Lempia Summerfield Katz LLC (57) ABSTRACT

Arrangements and methods for identifying a phase-to-ground inverter short circuit in an IT (isolé-terre or isolated ground) network are provided. In the method, AC current values of all three phases and DC current values are measured and evaluated at a frequency that is higher than the clock frequency of the inverter. An AC short-circuit current is also identified by subtracting the fundamental wave from the AC current sensor values. An AC component of the DC current sensor value is also identified, and it is identified whether this component is higher than a value predefined for regular operation. The AC short-circuit current and the AC component of the DC current sensor value are also compared. A short circuit is identified for the phase if the two values of the AC short-circuit current and the AC component of the DC current sensor value are approximately equal.

16 Claims, 8 Drawing Sheets

(51) Int. Cl.
*H02M 1/32* (2007.01)
*H02M 7/44* (2006.01)

(58) Field of Classification Search
CPC ........ H02M 7/515; H02M 7/521; H02M 7/53; H02M 7/537; H02M 7/5387; H02M 7/53871; H02H 3/00; H02H 3/08; H02H 3/083; H02H 3/087; H02H 3/10; H02H 3/105; H02H 3/16; H02H 3/162; H02H 3/165; H02H 3/167; H02H 3/17; H02H 3/18; H02H 3/26; H02H 3/28; H02H 3/305; H02H 3/307; H02H 3/32; H02H 3/331; H02H 3/332; H02H 3/34; H02H 3/353
USPC .... 363/15–17, 40–43, 50, 51, 55–56.12, 71, 363/95–99, 131–134; 361/42–50, 78, 79, 361/87, 93.1–102; 323/276–278
See application file for complete search history.

6.I — Lock short-circuited phase
6.II — Run through Region A of a vector diagram
6.III — Run through Region B of the vector diagram
6.IV — Run through Region C of the vector diagram
6.V — Run through Region B again

FIG 7

7.I — Reduce clock frequency
7.II — Run through Region A of a vector diagram
7.III — Run through Region B of the vector diagram
7.IV — Run through Region C of the vector diagram
7.V — Run through Region B again

| 32 | DC measuring unit |
|---|---|
| 34 a,b,c | AC current measurement units |
| 100 | Arrangement |
| 101 | DC ripple current identification unit |
| 102 | AC ripple current identification unit |
| 103 | Comparison unit |
| 104 | Short circuit identification unit |

FIG 11

100 Arrangement
110 Reconfiguration arrangement
111 Modification unit

IDENTIFICATION OF A PHASE-TO-GROUND INVERTER SHORT CIRCUIT

The present patent document claims the benefit of German Patent Application No. 10 2019 217 748.4, filed Nov. 18, 2019, which is hereby incorporated by reference.

TECHNICAL FIELD

The disclosure relates to a method for identifying a phase-to-ground inverter short circuit in an IT (isolé-terre or isolated ground) network. The disclosure furthermore relates to a method for reconfiguring an IT network affected by a phase-to-ground short circuit. The disclosure also relates to an arrangement for identifying a phase-to-ground inverter short circuit. The disclosure additionally relates to a reconfiguration arrangement.

BACKGROUND

Electric motors are being used increasingly in vehicles and aircraft. SUch systems may have a complex IT network (IT=isolé-terre or isolated ground) via which, inter alia, the electric motors are also monitored and controlled. Electric motors in such a system are part of the drivetrain, which also includes an inverter. SUch an inverter converts a DC voltage, which is provided for example by an accumulator battery, into a three-phase voltage, as is used by three-phase electric motors. If there is a fault in the region of the drivetrain, (e.g., a short circuit), this may result in the worst-case scenario in total failure of the electric motor, which may lead to a crash in the case of autonomously controlled aircraft. It would therefore be advantageous to promptly detect short circuits in the drivetrain and to initiate countermeasures in order to prevent failure of the electric motor during operation.

Figure 1:
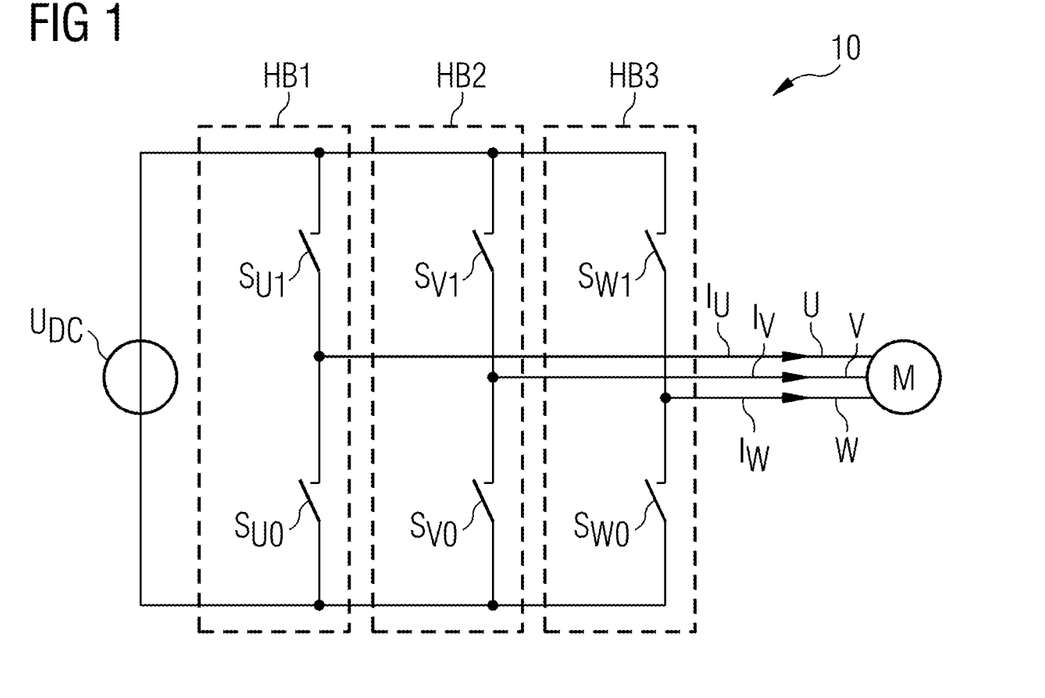
FIG. 1 depicts a schematic illustration of an example of a 3-phase 2-level inverter.
Figure 2:
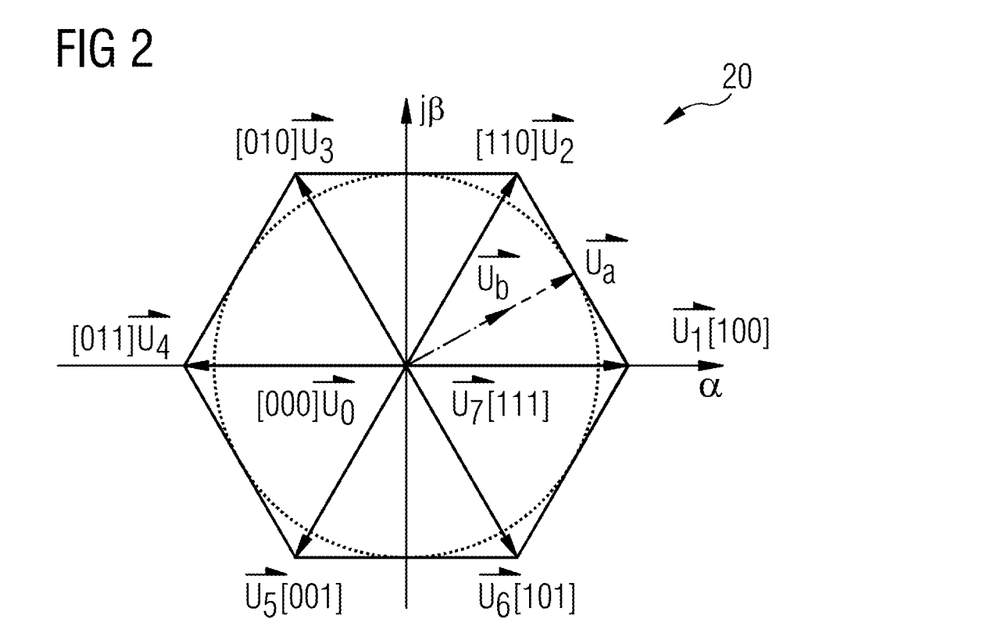
FIG. 2 shows a schematic illustration of an example of a vector diagram of a 3-phase 2-level inverter.

One inverter that may be installed in a drivetrain is what is known as a 3-phase 2-level inverter. FIG. 1 illustrates such an inverter. FIG. 2 shows a space vector diagram for such an inverter.

Up until now, short circuits have not been diagnosed using the inverter. Short circuits with respect to galvanically isolated ground in the IT network are monitored by insulation monitors. An insulation monitor cannot however be used to locate such a phase-to-ground short circuit at a particular phase. The occurrence of a short circuit across branches in the network, (e.g., in the case of parallel inverters), also cannot be located any more precisely without prior interventions (for example, disconnecting parallel circuits). In the case of HVDC-parallel-connected inverters, two inverters are connected in parallel to a battery or an HV network node. This results in problems because, in the case of a phase-to-ground short circuit, it is not possible, or possible only inaccurately, to identify the parallel inverter strand in which the short circuit has occurred. It is however critical to locate such a short circuit in order to disconnect it from the rest of the system in the event of doubt and to keep the rest of the system, which is not affected, in operation. "HVDC" in this case stands for high-voltage direct current. This term originates from the terminology of the electrification of motor vehicles, and refers to all DC voltage networks of more than 60 V. HV network nodes are therefore required in an IT network because distributed electric drives are used, that is to say not just one battery, one inverter and one motor, but rather in each case a multiplicity thereof. Different numbers of the individual components may in this case be installed. By way of example, such an IT network may include two powerful batteries, eight inverters, (e.g., four inverters per battery), and two inverters per motor. Due to the different number of components, a plurality of inverters are connected to one battery and therefore connected in parallel on the HV side.

The problem therefore arises of developing a method and an arrangement for identifying and compensating a phase-to-ground inverter short circuit, in which, in the case of a short circuit, the function of the rest of the system is as far as possible maintained in spite of the short circuit.

In the case for example of an electric aircraft, (e.g., a multicopter), the functionality of the rest of the system may be critical to the safety thereof.

SUMMARY AND DESCRIPTION

This object is achieved by a method for identifying a phase-to-ground inverter short circuit in an IT network, a method for reconfiguring an IT network affected by a phase-to-ground short circuit, an arrangement for identifying a phase-to-ground inverter short circuit, and a reconfiguration arrangement as disclosed herein. The scope of the present disclosure is defined solely by the appended claims and is not affected to any degree by the statements within this summary. The present embodiments may obviate one or more of the drawbacks or limitations in the related art.

In the method for identifying a phase-to-ground inverter short circuit, AC current values of all three phases and DC current values are measured and evaluated at a frequency that is higher than the clock frequency of the inverter. The abbreviation "DC" stands for "direct current" and is intended to be used in the entire application for that part of the IT network to which DC voltage is applied. The abbreviation AC stands for "alternating current" and is in turn intended to be used in the entire application for that part of the IT network to which a three-phase voltage, that is to say a three-phase AC voltage, is applied.

An AC short-circuit current is also identified by subtracting the fundamental wave generated through a control operation from the AC current sensor values. An AC component of the DC current sensor value is additionally identified, and it is identified whether this component is higher than a value predefined for regular operation. The sensor measured values, that is to say the sensor raw values and the values generated within the controller on the basis of the sensor raw values, have to have a bandwidth that is at least as great as the clock frequency. The bandwidth, that is to say the frequency range, which may also be reproduced with sufficient accuracy, has to be large enough to record the ripple current generated by the clock frequency with sufficient accuracy and to be able to evaluate it using the method. In other words, the frequency bandwidth of the sensors has to be at least as great as the clock frequency in order to record correspondingly faster changes that are the subject of the evaluation of the method.

Figure 3:
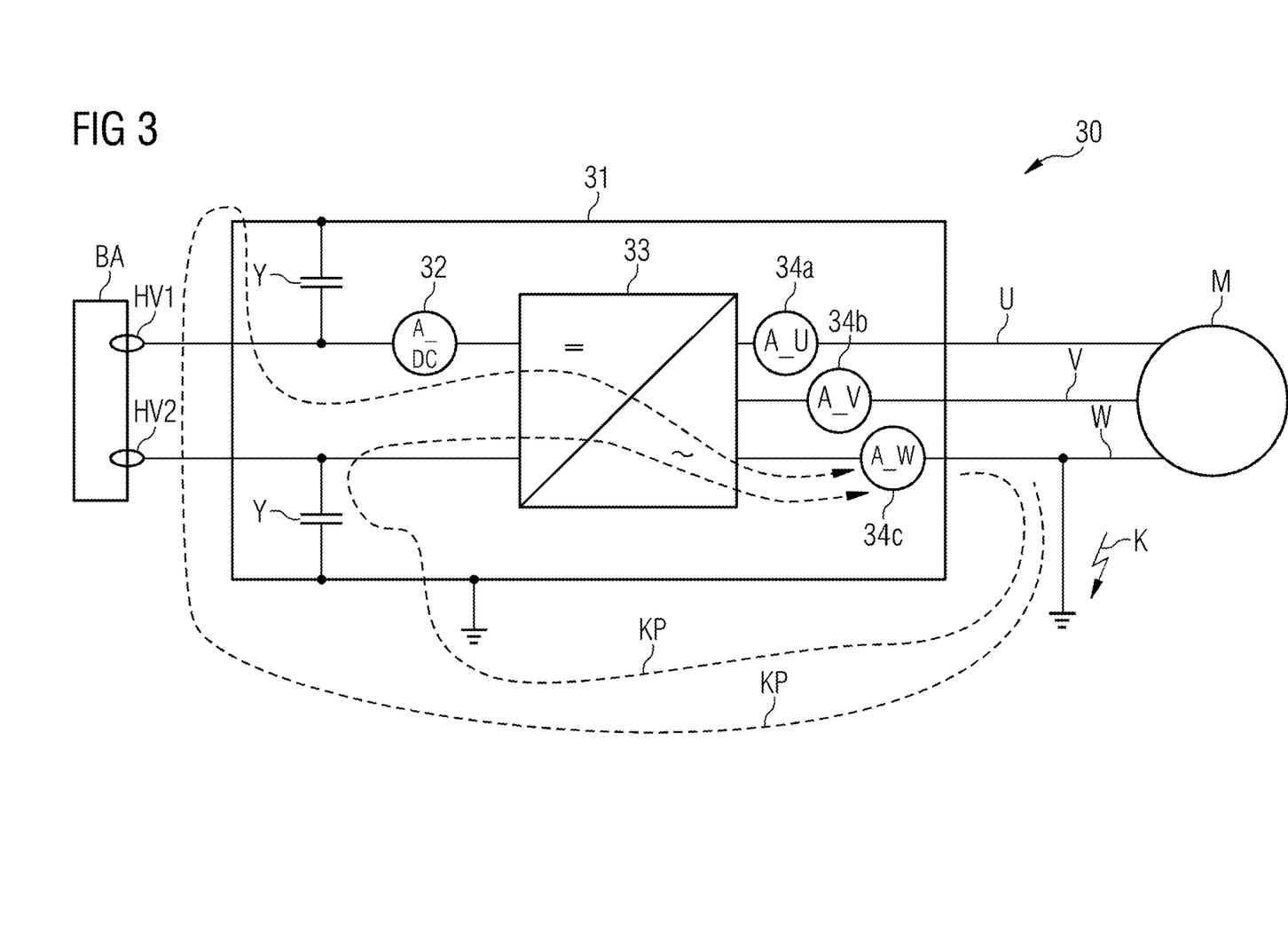
FIG. 3 shows a schematic illustration of an example of an inverter in an IT network drivetrain, in which by way of example phase W has a phase-to-ground short circuit.

If a phase is short-circuited to ground during clocked operation, then a current path is thereby formed that is closed via ground and the Y-capacitors arranged in the DC current circuit (see FIG. 3). In this respect, there are also IT networks in which Y-capacitors are not used, but rather the stray capacitances of other components are used instead. In each switching procedure of the switches installed in the inverter bridge circuit and cycling in the short-circuited phase, which alternately short-circuits the DC positive and DC negative potential to the galvanically isolated ground that is however capacitively coupled via the Y-capacitors, a current that recharges the Y-capacitors flows. In the region of the three-phase current set by the control operation, this current is overlaid with the current sinusoid in the short-circuited phase, specifically as a clock frequency harmonic, wherein the magnitude of what is known as the ripple, that is to say the deviations generated by the short circuit, depends on the sinusoidal current, on the magnitude of the short-circuit impedance, the magnitude of the intermediate circuit voltage UDC (=U_DC-positive−U_DC-negative) and the duration of the respective switching state, forming the short circuit, of the inverter bridge circuit. UDC-positive and UDC-negative are in this case the potentials of the contacts of the DC voltage source used as energy source in the IT network. By way of example, a high ripple current corresponds to a low-impedance short circuit. The phases that are not short-circuited to ground do not have this ripple current. When the DC current sensor is in a suitable position, that is to say when the DC current sensor is located in the current path of the short-circuit current, the ripple current also flows through the DC current sensor.

It may conventionally be the case that the ripple current is not recorded due to its high frequency, that is to say the clock frequency of the switches, in a comparison with the AC currents, which are recorded only at the lower frequency of the controller cycle. This is due to the fact that the actual AC current is smoothed when it is recorded using sensors. This smoothing may be performed by a filter or be achieved due to the fact that the AC current is recorded such that, during one cycle, the average value of the sensor current corresponds exactly to the sinusoidal current generated by the control operation. This means that the usual or conventional check as to whether all of the AC currents give the value 0 possibly does not work when identifying a phase-to-ground short circuit.

For this reason, the ripple currents are recorded at a relatively high frequency, both in the AC current circuit and in the DC current circuit. Because the ripple current caused by a short circuit also occurs in any case in the DC current circuit, by comparing the high-frequency AC components or the ripple currents present on the individual phases with the AC component of the DC current circuit, it is possible to identify the phase on which the ripple current is also occurring in the AC current circuit.

The AC short-circuit current and the AC component of the DC current sensor value are also compared. Finally, a short circuit is identified for the phase if the two values of the AC short-circuit current and the AC component of the DC current sensor value are approximately equal. This means both that the values match one another in terms of time and that the magnitude matches at the respective time. The identification method may be performed continuously during operation, that is to say the acts described above are continually repeated during operation. A DC current sensor is required to measure the DC and AC current values, and an AC current sensor is required for each of the three phases. It is advantageously possible to unambiguously determine the phase on which the short-circuit current occurs. Countermeasures are thereby able to be taken in a targeted manner in the course of what is known as a reconfiguration in order to prevent any damage that goes beyond the phase-to-ground short circuit to the drive system operated by the IT network, or even the failure thereof.

In the method for reconfiguring an IT network affected by a phase-to-ground short circuit, a short-circuited phase is located using the method for identifying a phase-to-ground inverter short circuit. A short circuit to ground in an IT network does not initially constitute a hazardous state, at least in the sense that damage could occur due to an electric shock. The motor operated by the IT network may also continue to be operated with controlled current, such that the drive function is in principle able to be maintained, as long as the maximum instantaneous value, boosted by the current ripple, of the phase current does not inadvertently trigger an overcurrent disconnection and thus stop operation of the inverter.

However, the ripple current triggered by the short circuit places a thermal load on components that are not designed for this load. This is the case in particular for the above-mentioned Y-capacitors for providing voltage symmetry of the IT network in the DC current circuit with respect to ground. It is therefore important firstly for the ripple current to be suppressed or at least reduced, but secondly for the motor to continue to be operated as far as possible.

A modulation of the inverter is also modified such that the AC short-circuit current is reduced. The modulation may be influenced by changing the clocking of the switches. The short-circuited phase may be driven using clocking different from the other phases. The clock frequency of one or more switches may also be changed. As already mentioned, such a measure may prevent damage to the drive system operated by the IT network, or even failure thereof. In other words, current loading is able to be reduced in the event of a short circuit, and the motor function is still able to be maintained.

The arrangement for identifying a phase-to-ground inverter short circuit has at least three AC current measurement units for measuring and evaluating AC current values of all three phases and at least one DC measurement unit for measuring DC current values at a frequency that is higher than the clock frequency of the inverter. One part of the arrangement for identifying a phase-to-ground inverter short circuit is also a DC ripple current identification unit for identifying an AC component of the DC current sensor value and for identifying whether this component is higher than a value predefined for regular operation. The arrangement for identifying a phase-to-ground inverter short circuit has an AC ripple current identification unit for identifying an AC short-circuit current by subtracting the fundamental wave from the AC current sensor values. One part of the arrangement is also a comparison unit for comparing the AC short-circuit current and the AC component of the DC current sensor value. The arrangement for identifying a phase-to-ground inverter short circuit also includes a short circuit identification unit for identifying a short circuit for the phase for which the two values of the AC short-circuit current and the AC component of the DC current sensor value are approximately equal. The arrangement for identifying a phase-to-ground inverter short circuit shares the advantages of the method for identifying a phase-to-ground inverter short circuit.

The reconfiguration arrangement has the arrangement for identifying a short-circuited phase. One part of the reconfiguration arrangement is also a modification unit for modifying the modulation of the inverter such that the AC short-circuit current is reduced. The reconfiguration arrangement shares the advantages of the method for reconfiguring an IT network affected by a phase-to-ground short circuit.

Some parts of the arrangement for identifying a phase-to-ground inverter short circuit and of the reconfiguration arrangement may for the most part be designed in the form of software components, possibly with the addition of necessary hardware components. This applies in particular to parts of the DC ripple current identification unit, of the AC ripple current identification unit, of the comparison unit, of the short circuit identification unit and of the modification unit. These components may however in principle also be implemented partly in the form of software-supported hardware, for example FPGAs or the like, in particular when particularly fast calculations are required. The required interfaces may likewise be designed as software interfaces, for example, when it is required only to transfer data from other software components. They may however also be designed as interfaces in the form of hardware that are driven by suitable software.

An implementation partly in the form of software has the advantage that computer systems already previously used in IT networks are also easily able to be retrofitted by adding hardware units for measuring current strengths through a software update in order to operate in the manner. This is possible as long as the bandwidth of the current sensors is high enough in comparison with the clock frequency. In this respect, the object is also achieved by a corresponding computer program product containing a computer program that is able to be loaded directly into a storage apparatus of such a computer system, containing program sections for executing all of the acts of the method for identifying a phase-to-ground inverter short circuit and of the method for reconfiguring an IT network affected by a phase-to-ground short circuit when the computer program is executed in the computer system.

SUch a computer program product may include, in addition to the computer program, additional parts, such as documentation and/or additional components, including hardware components, such as hardware keys (dongles etc.) for using the software.

For transportation to the storage apparatus of the computer system and/or for storage on the computer system, use may be made of a computer-readable medium, (e.g., a memory stick, a hard disk, or another transportable or fixedly installed data carrier), on which those program sections of the computer program that are able to be read and executed by a computer unit are stored. The computer unit may include one or more interacting microprocessors or the like.

The following description contain particularly advantageous refinements and developments of the disclosure. The claims of one claim category may in this case in particular also be developed analogously to the claims of another claim category. In addition, in the context of the disclosure, the various features of different exemplary embodiments and claims may also be combined to form new exemplary embodiments.

In one variant of the method for identifying a phase-to-ground inverter short circuit, it is additionally checked whether the frequency of the AC short-circuit current and the frequency of the AC component of the DC current sensor value are approximately equal. Because the frequency of the ripple current generated by the short circuit occurs both in the DC current circuit and in the short-circuited phase, the short-circuited phase is able to be identified by comparing the frequencies of the AC components of the different current circuits. As an alternative or in addition, a Fourier transformation may also be applied to the identified measured values. What is known as an online FFT (FFT=Fast Fourier Transformation) is particularly suitable here. This may be used to directly identify the corresponding frequency components of the sought ripple current. The reliability of the short-circuit analysis is advantageously able to be further improved through this additional measure.

In the method for identifying a phase-to-ground inverter short circuit, the insulation integrity of those parts in the IT network to which operating voltage is applied with respect to ground may be additionally measured using an insulation monitor. It is assumed in this case that the short circuit has been detected correctly when the measured value from the insulation monitor also indicates an insulation rupture to ground. This additional redundant measurement may advantageously be used to confirm that an insulation rupture is present.

It is pointed out in this connection that the fault diagnosis using insulation monitors unfortunately requires a relatively large amount of time, in some cases several 100 ms. This is a further disadvantage of the conventional application of insulation monitors, in addition to the inability to accurately locate the short circuit. Applying an insulation monitor for fault diagnosis is thus not always possible or not possible when there is not enough time for this before the inverter would go into overcurrent mode and therefore has to be controlled so as to counter this.

The measurement therefore may take place subsequently using the insulation monitor, rather than this triggering the reconfiguration. This means that the measurement using the insulation monitor is intended to confirm re-established insulation integrity following a reconfiguration.

In one refinement of the reconfiguration method, modifying the modulation of the inverter includes the following measure: actively locking the short-circuited phase to either DC+ potential or DC− potential.

The short-circuited phase is in this case locked to either DC+ potential or DC− potential. This means that one of the two switches assigned to the located phase is permanently switched on, more precisely remains in the on state, instead of switching over at the clock frequency, and the complementary switch is switched off, more precisely remains in the off state. In order to set the space vector length, only that null vector with the permitted switching configuration may then be used for the short-circuited phase. The complementary null vector is no longer permitted in this variant. Configuring the null vector means that all of the upper switches of the bridge circuit (see FIG. 1) are switched to "On", that is to say are in the on state, and all of the lower switches are complementarily switched to "Off", that is to say are in the off state, or vice versa.

In the space vector modulation for driving the motor, only the non-short-circuited phases or the switches assigned thereto are then switched over. All of the required vectors are thereby no longer switched in order to generate the sinusoidal waves, as a result of which additional harmonics occur in the current and in the torque in comparison with non-fault clocking. Although harmonics occur in any case, their magnitude increases in this case, and their frequency may also change. This may lead to increased noise or increased EMC emissions, but the motor remains functional with reduced maximum power and a sufficiently high rotational speed. The rotor in this case drifts through the regions of vectors that are not actively set due to the moment of inertia of the rotor. In this respect, an electric motor may be operated in the partial load region and only runs at full load in certain situations. In this advantageous variant, it is therefore necessary to accept a power reduction due to the reconfiguration only in these rare full-load situations, whereas the partial load mode advantageously remains unimpaired.

There may also be a switch to freewheeling mode in an emergency, (e.g., as pulse blocker or active short circuit). In the case of the pulse blocker, all six switches in the inverter are permanently switched to "Off". Only the diodes connected deliberately or in an intrinsically stray manner to the switches are reverse-biased in one direction. The motor coasts to a stop in freewheeling mode. This normally takes place without any current, that is to say virtually without any torque on the side of the electromagnetic system of the motor. Only the moment of friction of the bearing or, in the case of an aircraft, the propeller brake the motor. There are specific situations in which a high unwanted braking torque and thus unwanted currents arise. This may occur in particular at high rotational speeds or at low DC voltages. In this case, it may be advantageous to switch to an active short circuit.

In the case of an active short circuit, one of the two null vectors is permanently applied, that is to say either all of the upper switches or all of the lower switches of the bridge circuit of the inverter are switched to "On". All three motor phases are thus short-circuited with one another. A permanently excited synchronous motor, as long as it is rotating, is then not free from current but, precisely in the problematic regions on the side of the pulse blocker, no or no noteworthy braking torques are produced or no/barely any noteworthy braking torques are generated.

As an alternative, modifying the modulation of the inverter may also include reducing the clock frequency of the inverter. Unlike in the above variant, in this variant the generation of the space vectors remains completely intact, and the clocked driving of the switches of the inverter is thus also continued for the switches of the short-circuited phase. The frequency of the ripple current decreases as a result of the lower clock frequency, because the ripple current results from a capacitive reactance between the IT network and ground. What are particularly advantageous, because they are comparatively easy to implement, are integer reductions, such as for example a reduction of the clock frequency by a half or a third. The full power of the motor is in this case maintained. A certain energy loss and a certain loading of components may occur due to a relatively low ripple current that still occurs in spite of the reduction in the clock frequency.

The above two measures are particularly advantageously combined. SUch a combination includes maintaining the full clock frequency for regions of the vector diagram in which no switching over of the switches takes place for the short-circuited phase. It is thus necessary to switch over only twice or once per half-wave when the space vector revolves once. For the short-circuited phase, that effectively corresponds to a considerably reduced clock frequency. In this case too, when setting the space vector length, only that null vector with the permitted switching configuration may then be used for the short-circuited phase. The complementary null vector is no longer permitted in this variant.

BRIEF DESCRIPTION OF THE DRAWINGS

The disclosure is explained again in more detail below with reference to the appended figures on the basis of exemplary embodiments. In the figures.

DETAILED DESCRIPTION

FIG. 1 shows a schematic illustration of a three-phase system. SUch a three-phase system has a half-bridge HB1, HB2, HB3 for each of the three phases. By virtue of switching the half-bridges HB1, HB2, HB3, the output voltage of the individual phases U, V, W is able to be set both to the positive and to the negative intermediate circuit potential UDC. As may be seen in the circuit, only one switch $S_{U0}$, $S_{U1}$, $S_{V0}$, $S_{V1}$, $S_{W0}$, $S_{W1}$ may ever be closed in each half-bridge, because otherwise the intermediate circuit voltage within the half-bridge is short-circuited. For the further comments, it is assumed that a respective switch $S_{U0}$, $S_{U1}$, $S_{V0}$, $S_{V1}$, $S_{W0}$, $S_{W1}$ is closed in each half-bridge HB1, HB2, HB3. A certain potential is thus present in each phase at each time. Each half-bridge HB1, HB2, HB3 may therefore adopt two states. In the first state, the upper switch $S_{U1}$, $S_{V1}$, $S_{W1}$ is closed, and in the second state, the lower switch $S_{U0}$, $S_{V0}$, $S_{W0}$ is closed.

At the time of the switchover between the switched-on state of the upper half-bridge and the switched-on state of the lower half-bridge, the switch that is currently switched on first of all has to be switched off. There is then a very short wait until the other switch is then switched on. This is what is known as the bridge locking time, during which both switches are switched to "Off" within the half-bridge. This is very short in comparison with the cycle time, specifically of the order of magnitude of approximately 1% of the cycle time.

Each half-bridge HB1, HB2, HB3 may adopt two different switch settings. Because three half-bridges are required for a three-phase current system, this results in $2^3$ possible switch settings and thus 8 switching states. At each switch setting, this results in a different voltage constellation at the motor between the phases U, V, W and thus also a different voltage space vector. The two switch settings in which either all three upper switches $S_{U1}$, $S_{V1}$, $S_{W1}$ or all three lower switches $S_{U0}$, $S_{V0}$, $S_{W0}$ are closed constitute an exception. In these switch settings, all three phases are short-circuited. It is thus not possible to measure any voltage, or any voltage as a first approximation, between the phases. These two voltage vectors are referred to as null voltage space vectors.

FIG. 2 shows the schematic illustration of a vector diagram 20 of a 3-phase 2-level inverter. The vector diagram 10 shows the individual voltage space vectors that may be set in the case of a three-phase two-level inverter.

Such a three-phase system (see FIG. 2) may be implemented using three half-bridges HB1, HB2, HB3 connected in parallel.

The individual phases are assigned different vectors. [100] means, for example, that the three phases U, V, W are switched to U+, V− and W−. One revolution corresponds to one full electrical rotation of the electrical machine. A total of 8 base voltage vectors $U_0$ to $U_7$ are illustrated. $U_0$ and $U_7$ are what are known as null voltage space vectors in the case of which it is not possible to measure any voltage between the phases. There are also 6 active voltage space vectors $U_1$ to $U_6$. The table below depicts in each case the chained output voltages from the 8 switch settings that may occur.

| Base voltage space vector | Half-bridge 1 $SU_1/SU_0$ | Half-bridge 2 $SV_1/SV_0$ | Half-bridge 3 $SW_1/SW_0$ | $U_{UV}$ | $U_{VW}$ | $U_{WU}$ |
|---|---|---|---|---|---|---|
| $U_0$ | 0 | 0 | 0 | 0 V | 0 V | 0 V |
| $U_1$ | 1 | 0 | 0 | $+U_{DC}$ | 0 V | $-U_{DC}$ |
| $U_2$ | 1 | 1 | 0 | 0 V | $+U_{DC}$ | $-U_{DC}$ |
| $U_3$ | 0 | 1 | 0 | $-U_{DC}$ | $+U_{DC}$ | 0 V |
| $U_4$ | 0 | 1 | 1 | $-U_{DC}$ | 0 V | $+U_{DC}$ |
| $U_5$ | 0 | 0 | 1 | 0 V | $-U_{DC}$ | $+U_{DC}$ |
| $U_6$ | 1 | 0 | 1 | $+U_{DC}$ | $-U_{DC}$ | 0 V |
| $U_7$ | 1 | 1 | 1 | 0 v | 0 V | 0 V |

The basic principle is that of generating a rotating field in the motor: Three individual electromagnetic fields are generated in the motor from the three individual sinusoidal currents, phase-shifted by 120° with respect to one another, of the individual phases. These are overlaid to form a resultant revolving rotating field that generates the torque. The currents are in turn generated by applying voltages to the motor inductance in a targeted manner.

To achieve this, the basic principle of space vector modulation is applied as prior art. If it is desired for example to output a voltage space vector $U_a$ that has exactly half the angle of the voltage space vector $U_1$ and $U_2$, this voltage space vector $U_a$ may be created by alternately outputting the voltage space vector $U_1$ and the voltage space vector $U_2$. The duration for which each voltage space vector is applied depends on the switching frequency of the modulation. What is decisive for the resultant voltage space vector is just the ratio between the two times for the respective voltage space vectors $U_1$ and $U_2$. If the voltage space vector $U_a$ is thus intended to be situated precisely between the two voltage space vectors U1 and U2, then the two times thus have to be selected to be of exactly equal length in order to achieve the desired voltage space vector. The low-pass effect of the stator windings results, in the three-phase current machine, in an averaged current and thus the desired space vector with the desired orientation.

The control logic thus has to initially check in which of the six sectors the desired voltage space vector is located, and alternately output the two relevant base voltage space vectors. The ratio between the times for which each of the two voltage space vectors $U_1$, $U_2$ has to be applied results from the relative angle of the desired voltage space vector with respect to the angles of the relevant base voltage space vectors.

If the amplitude of the output voltage, that is to say also the magnitude of the voltage space vector, is intended to be selected as desired, then the null voltage space vectors $U_0$, $U_7$ are also required. If it is then desired for example to output the voltage space vector $U_b$, then the ratio between the output times of the voltage space vectors $U_1$ and $U_2$ has to be exactly equal. In order to be able to reduce the magnitude of the resultant voltage space vector $U_b$, an additional time is introduced in which a null voltage space vector is output. The magnitude of the resultant voltage space vector thus depends on the ratio between the switched-on time of the active voltage space vector and the switched-on time of the null voltage space vector.

To output any desired voltage space vectors, each switching period is divided for example into three time intervals. In two of these time intervals, the two active voltage space vectors are output, and in the third time interval, a passive voltage space vector, that is to say a null voltage space vector $U_0$, $U_7$, is output. The three voltage space vectors that are involved are thus pulse width-modulated.

A modulation in which the time interval of the null vector is broken down into two regions within one cycle is particularly commonly selected in the prior art. The vector/time areas therefore do not change, because only the null vector time is divided into two time sections. There are then thus four time voltages per cycle, as it were. FIG. 3 illustrates a schematic illustration of an arrangement 30 of an inverter 31 in an IT network drivetrain. The arrangement includes a battery BA that provides a DC voltage across the two terminals HV1, HV2. The inverter 31 is connected to the DC voltage of the battery BA. The inverter 31 is installed in a housing, which may be made from metal and is grounded. The inverter 31 includes a bridge circuit 33 that has the structure illustrated in FIG. 1. Also forming part of the inverter 31 are two Y-capacitors Y that galvanically isolate the DC voltage side of the inverter 31 with respect to the housing, but capacitively couple it thereto and thus provide voltage symmetry of DC+ and DC− of the IT network with respect to ground. A DC current measurement unit 32, which measures the current strength in the DC current region, is also located on the DC voltage side (on the left in FIG. 3). Three AC current measurement units 34a, 34b, 34c are located on the output side of the bridge circuit, that is to say to the right of the bridge circuit 33 of the inverter 31. Each of the AC current measurement units 34a, 34b, 34c measures the AC current in one of the phase lines U, V, W of a three-phase current. The three-phase current is forwarded by the inverter 31 to a three-phase current motor M. If a short circuit occurs, for example in the phase W, as illustrated in FIG. 3, then the short-circuit current is channeled from the phase W via ground and via the (e.g., grounded) inverter housing, via the Y-capacitor to the inverter and back to the W-phase.

Figure 4:
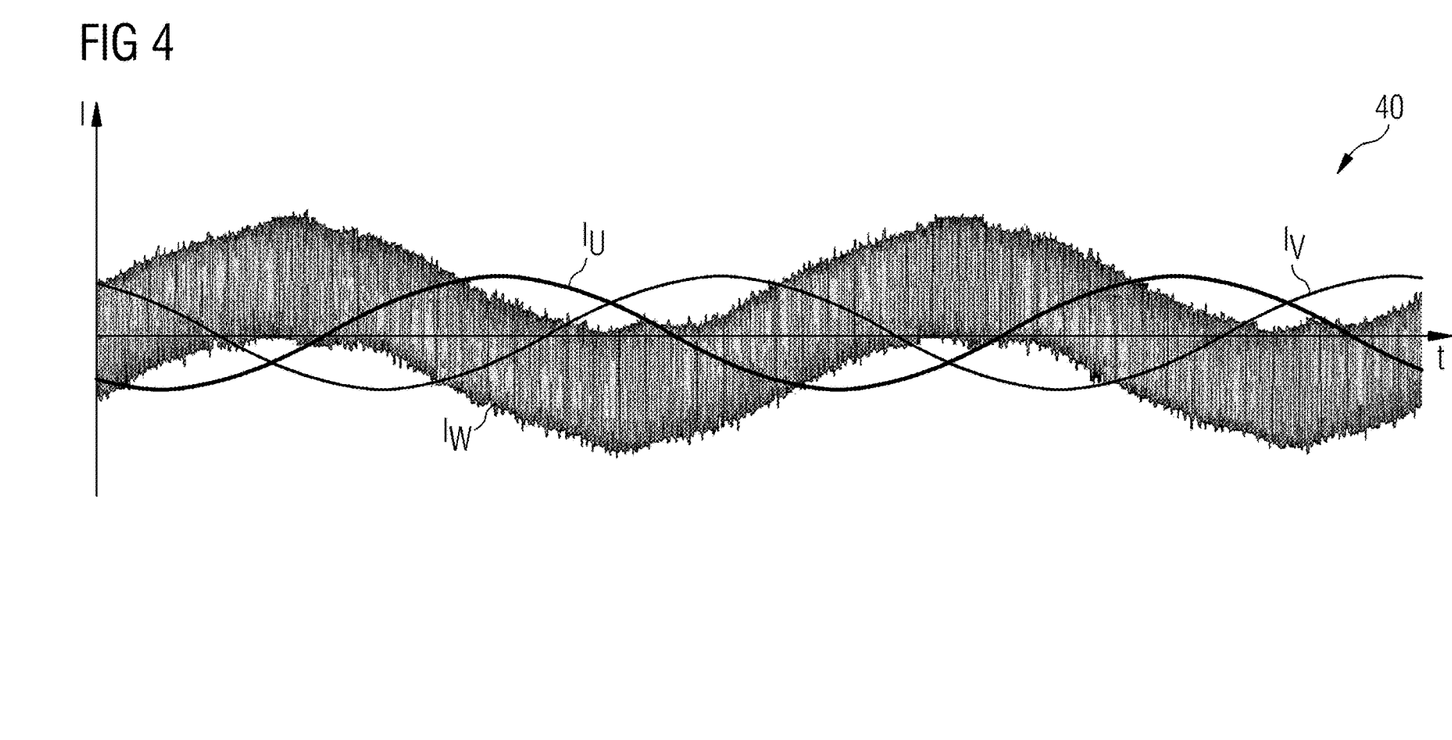
FIG. 4 depicts an example of an oscillogram of a result of a phase-to-ground short-circuit test in a drivetrain in an IT network.

FIG. 4 shows an oscillogram 40 of a result of a phase-to-ground short-circuit test in a drivetrain in an IT network. The oscillogram shows a measurement result of a phase-to-ground short-circuit test performed on a test bench with a drivetrain inserted into a prototype. The three phase currents $I_u$, $I_v$, $I_w$ are each controlled sinusoidally through space vector modulation. The W-phase exhibits a ripple component, that is to say a high-frequency AC current that is overlaid on the slow sinusoid. This short-circuit current flows through the Y-capacitors and the current sensors (see FIG. 3). The DC current sensor is located between a Y-capacitor and the bridge circuit and therefore measures the short-circuit current.

Figure 5:
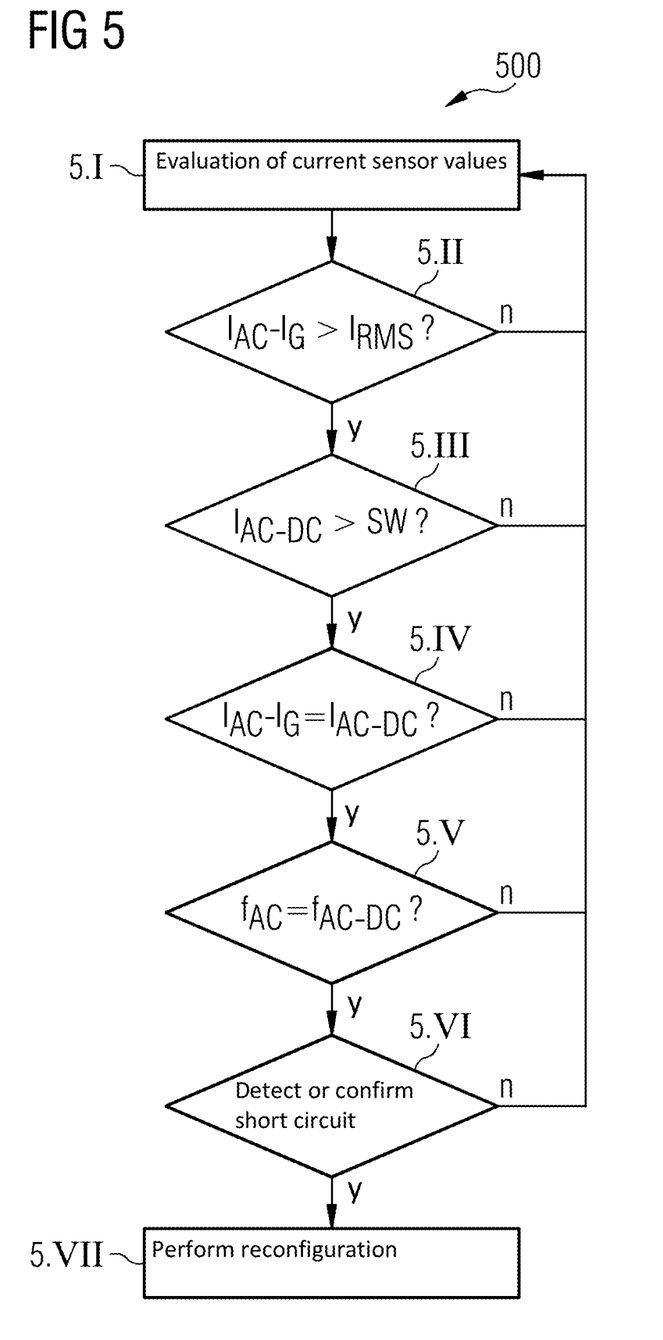
FIG. 5 depicts a flowchart that illustrates a method for identifying a phase-to-ground short circuit according to one exemplary embodiment.

FIG. 5 illustrates a flowchart 500 of a method for identifying a phase-to-ground short circuit according to one exemplary embodiment. In act 5.I, evaluation of current sensor values from three AC current measurement units and from one DC current measurement unit is clocked at a frequency that is higher than the clock frequency of the switches of the inverter of the IT network. In act 5.II, the AC current sensor values $I_{AC}$ are evaluated by subtracting a fundamental wave $I_G$ from the respective current measured value. A required condition for the occurrence of a phase-to-ground short-circuit current is then that there is still a significant AC component in a phase. This is higher than is caused by normal current ripple $I_{RMS}$. The magnitude of the normal current ripple depends on the clock frequency, the DC voltage, and the motor inductance. If it is identified in act 5.II that the measured ripple current is greater than the normal ripple current $I_{RMS}$, this being denoted "y" in FIG. 5, then there is a transition to act 5.III. If on the other hand in act 5.II a ripple current is measured that corresponds to the normal ripple current $I_{RMS}$ in terms of magnitude, this being denoted "n" in FIG. 5, then there is a return to act 5.I, and the monitoring process illustrated in FIG. 5 is performed again at act 5.I or 5.II.

In act 5.III, it is checked further whether the DC current $I_{DC}$ has an AC component $I_{AC\text{-}DC}$ that is higher than the usual AC component. The usual AC component depends on the DC voltage, the clock frequency, and the magnitude of the controlled AC current at a given motor inductance. If it is identified in act 5.III that the AC component $I_{AC\text{-}DC}$ is greater than a predetermined threshold value SW, this being denoted "y" in FIG. 5, then there is a transition to act 5.IV. If on the other hand in act 5.III an AC component $I_{AC\text{-}DC}$ is measured that does not exceed the predefined threshold value in terms of magnitude, this being denoted "n" in FIG. 5, then there is a return to act 5.I, and the monitoring process illustrated in FIG. 5 is performed again at act 5.I or 5.II.

In act 5.IV, it is identified, as a third required condition, whether the two high ripple currents recorded in act 5.II and act 5.III are of approximately equal magnitude. The evaluation that took place in act 5.II already gives the information as to the phase in which the short circuit occurred, such that the short-circuit current is able to be located accurately. Even more additional acts may be performed in order to make the diagnosis more reliable. If it is identified in act 5.IV that the two ripple currents are of approximately equal value, this being denoted "y" in FIG. 5, then there is a transition to act 5.V. If on the other hand it is identified in act 5.IV that the two ripple currents differ significantly in terms of magnitude, this being denoted "n" in FIG. 5, then there is a return to act 5.I, and the monitoring process illustrated in FIG. 5 is performed again at act 5.I or 5.II.

In act 5.V, in the exemplary embodiment illustrated in FIG. 5, a frequency comparison between the frequencies of the ripple currents recorded in acts 5.II and 5.III is additionally performed. If these are approximately equal, then this also indicates the occurrence of a phase-to-ground short circuit. If the two frequencies were identified as approximately equal, this being denoted "y" in FIG. 5, then there is a transition to act 5.VI. If on the other hand the two frequencies were identified as differing significantly from one another, this being denoted "n" in FIG. 5, then there is a return to act 5.I, and the monitoring process illustrated in FIG. 5 is performed again at act 5.I or 5.II.

In act 5.VI, the reliability of diagnosing the occurrence of a short circuit is increased further by detecting or confirming the short circuit using an insulation monitor external to the inverter. If the insulation monitor indicates an insulation rupture, then this attests to the correctness of the diagnosis in the previous acts. If it was identified in act 5.VI using the insulation monitor that an insulation rupture was present, this being denoted "y" in FIG. 5, then a reconfiguration on the basis of the short-circuit diagnosis that took place is performed in act 5.VII. If on the other hand such a short circuit is not confirmed in act 5.VI, this being denoted "n" in FIG. 5, then there is a return to act 5.I, and the monitoring process illustrated in FIG. 5 is continued at act 5.I or 5.II.

As already discussed, fault diagnosis using insulation monitors unfortunately requires a relatively large amount of time, in some cases several 100 ms.

An additional application for an insulation monitor in connection with identifying a short circuit would therefore be more expedient for a subsequent plausibility check in such a case, in other words in order to be able to possibly return the inverter to the original state in the case of a fault diagnosis to which a response has however already been provided. Act 5.VI would thus take place in such an exemplary embodiment only following a fault diagnosis and a performed reconfiguration, as illustrated in FIG. 6, and would be used to confirm the insulation integrity of the system.

Figure 6:
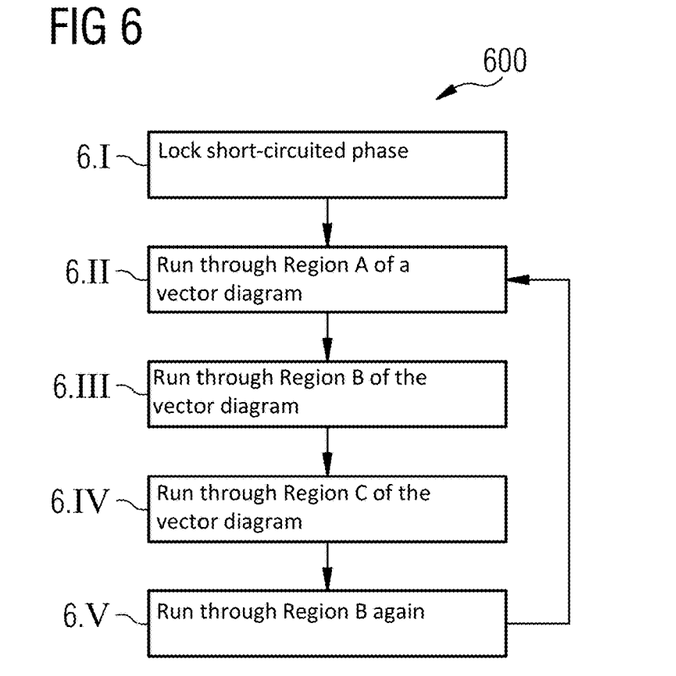
FIG. 6 depicts a flowchart that illustrates a method for reconfiguring an IT network following a phase-to-ground short circuit according to a first exemplary embodiment.

FIG. 6 shows a flowchart 600 that illustrates a method for reconfiguring an IT network following a short circuit recorded using the method shown in FIG. 5. In act 6.I, following detection of the short-circuited phase in accordance with the method explained in FIG. 5, the short-circuited phase is locked to one of the DC voltage potentials DC+ or DC−. This means that the corresponding switch at DC+ or DC− remains permanently switched on, instead of changing its switch setting at the clock frequency. In act 6.II, a region A (see FIG. 9) of the vector diagram is run through. This region corresponds to the space vectors $U_4$ to $U_6$ illustrated in FIG. 2 and FIG. 9. In region A, it is possible to switch all of the voltage space vectors required to generate a sinusoidal wave, such that no interference, such as for example harmonics, occurs in the current and torque in this region. In act 6.III, a region B (see FIG. 9) is run through, in which only the space vector $U_6$ is still able to be driven. There is reduced reproduction accuracy of the sinusoidal current in this region, because the space vector $U_1$ is unavailable. In act 6.IV, region C is run through (see FIG. 9). It is not possible to generate any space vectors in this region, that is to say that the rotor of the three-phase current motor drifts through this region by virtue of its moment of inertia. In act 6.V, region B (see FIG. 9) is run through again, in which only the space vector $U_4$ is able to be driven. There is then a return to act 6.II, and region A is run through again.

Figure 7:
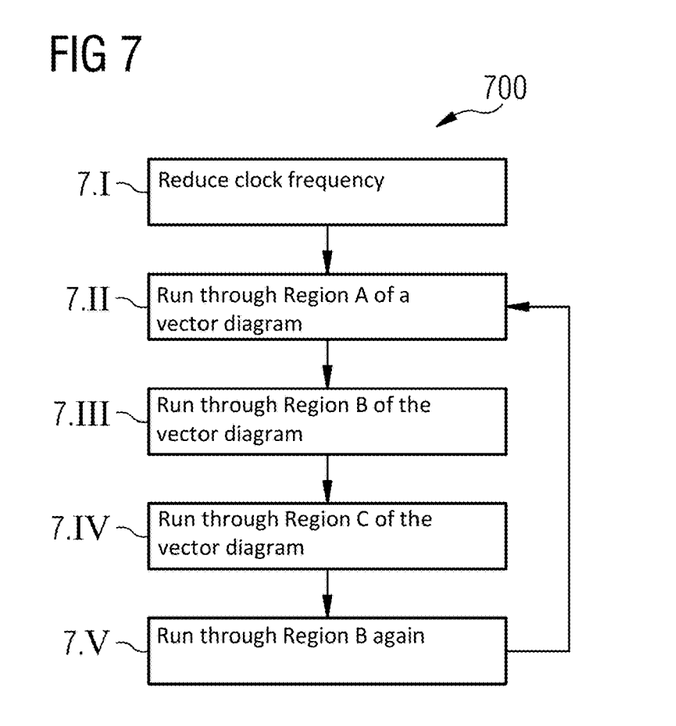
FIG. 7 depicts a flowchart that illustrates a method for reconfiguring an IT network following a phase-to-ground short circuit according to a second exemplary embodiment.

FIG. 7 shows a flowchart 700 that illustrates a method for reconfiguring an IT network following a short circuit recorded using the method shown in FIG. 5. Unlike the reconfiguration method illustrated in FIG. 6, in the method shown in FIG. 7, the short-circuited phase is not locked to either the DC+ or DC− potential. The clock frequency of the complete space vector modulation is rather reduced in act 7.I. To the same extent as the clock frequency is reduced, the magnitude of the RMS ripple current is also reduced, because the current flows through a capacitive reactance. This means that the ripple current arises due to the switching-induced change in the voltage potential via the capacitances to ground, e.g., the Y-capacitors. An integer reduction in the clock frequency is particularly easy to implement in technical terms. A non-integer reduction or a sliding reduction may however also be implemented. At lower clock frequencies, however, the ripple currents that are normally also present in the case of an intact network increase. The proportion of harmonics and thus motor losses increase. In the case of a greatly reduced clock frequency, although it is possible to obtain the maximum power, this is possibly not able to be maintained for as long as in normal operation. There furthermore continues to be increased loading of components that are not designed for this, and there are also increased losses due to higher control-induced ripple current.

In act 7.II, a region A (see FIG. 9) of the vector diagram is run through. This region corresponds to the space vectors $U_4$ to $U_6$ illustrated in FIG. 2 and FIG. 9. In region A, as in the method illustrated in FIG. 6 as well, it is possible to switch all of the voltage space vectors required to generate a sinusoidal wave, such that no interference, such as for example harmonics, occurs in the current and torque in this region. In act 7.III, a region B (see FIG. 9) is run through. Because, in the method shown in FIG. 7, it is possible to switch all of the space vectors, in this case, unlike in the method shown in FIG. 6, there is no reduced reproduction accuracy of the sinusoidal current. In act 7.IV, region C is run through (see FIG. 9). In this region, unlike in the method illustrated in FIG. 6, it is then possible to generate all of the space vectors. This means that the rotor of the three-phase current motor does not drift through this region by virtue of its moment of inertia, but rather runs through it in accordance with a sinusoidal wave generated by the voltage space vectors. In act 7.V, region B (see FIG. 9) is run through again, in which all of the space vectors are likewise able to be driven. There is then a return to act 7.II, and region A is run through again.

Figure 8:
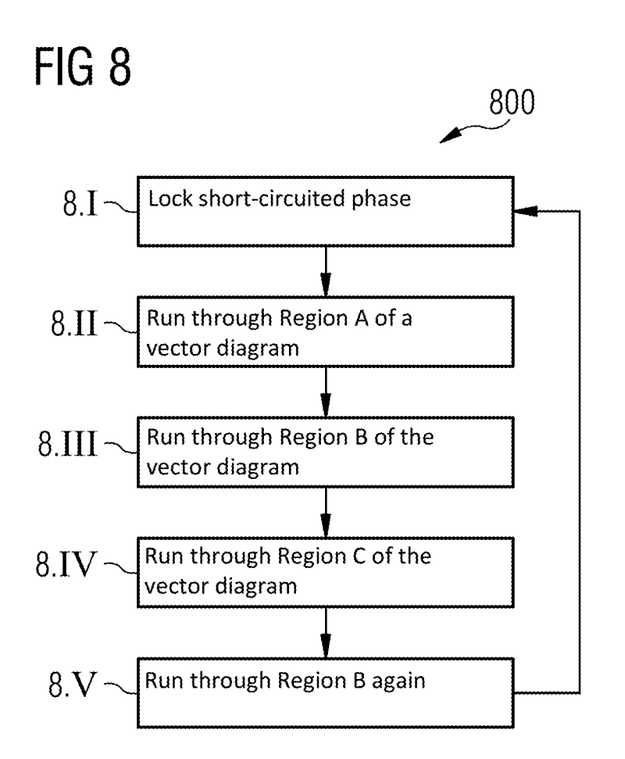
FIG. 8 depicts a flowchart that illustrates a method for reconfiguring an IT network following a phase-to-ground short circuit according to a third exemplary embodiment.

FIG. 8 shows a flowchart 800 that illustrates a method for reconfiguring an IT network following a short circuit recorded using the method shown in FIG. 5. The method illustrated in FIG. 8 constitutes a kind of combination of the two method variants illustrated in FIG. 6 and FIG. 7. In the method illustrated in FIG. 8, the short-circuited phase is first of all locked to the DC voltage potential DC+ in act 8.I. This means that the corresponding switch at DC+ remains switched on for a relatively long time, instead of changing its switch setting at the clock frequency. In act 8.II, a region A (see FIG. 9) of the vector diagram is run through. This region corresponds to the space vectors $U_4$ to $U_6$ illustrated in FIG. 2 and FIG. 9. In region A, it is possible to switch all of the vectors required to generate a sinusoidal wave such that no interference, (e.g., harmonics), occurs in the current and torque in this region. In act 8.III, a region B (see FIG. 9) is run through in which only the space vector $U_6$ is still able to be driven. There is reduced reproduction accuracy of the sinusoidal current in this region, because the space vector $U_1$ is unavailable. In act 8.IV, the switch of the short-circuited phase is set to DC− when region C is driven (see FIG. 9). By virtue of this switchover, it is possible to switch all of the vectors required for a sinusoidal wave in region C as well such that no interference, (e.g., harmonics), occurs in the current and torque in this region. In act 8.V, region B (see FIG. 9) is run through again in which only the space vector $U_3$ is able to be driven. There is then a return to act 8.I and the short-circuited phase is locked to the DC voltage potential DC+, and then region A is run through again.

Figure 9:
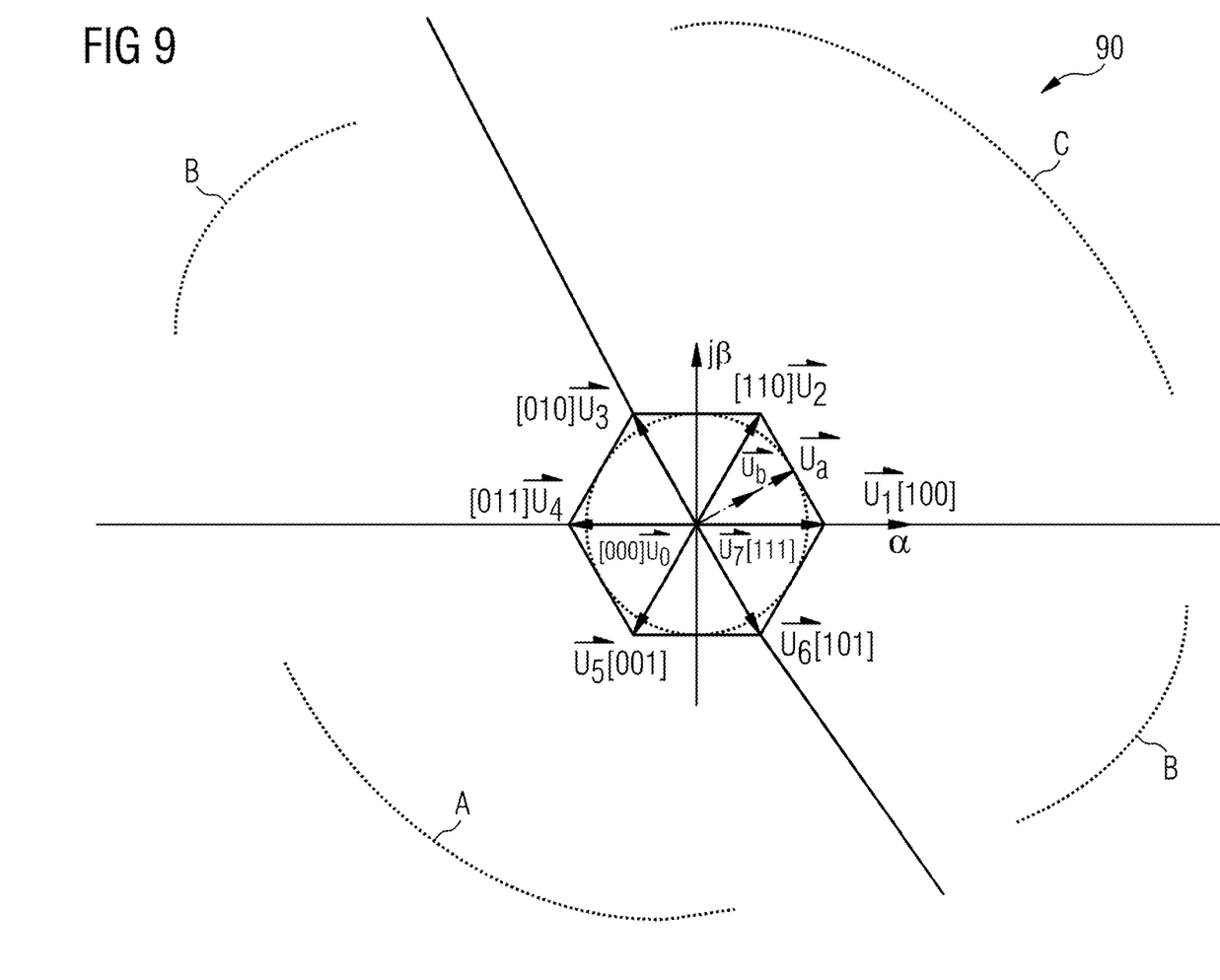
FIG. 9 depicts a schematic illustration of an example of a vector diagram of an inverter with a reconfiguration in the case of a phase-to-ground short circuit.

FIG. 9 shows a schematic illustration of a vector diagram of an inverter with a reconfiguration in the case of a phase-to-ground short circuit. The vector diagram has different sectors A, B, and C. Sector A has the characteristic that the phase w is in this case at DC+. The two sectors B are transition regions in which the phase w is switched over to DC−. In sector C, the phase w is at DC−.

Figure 10:
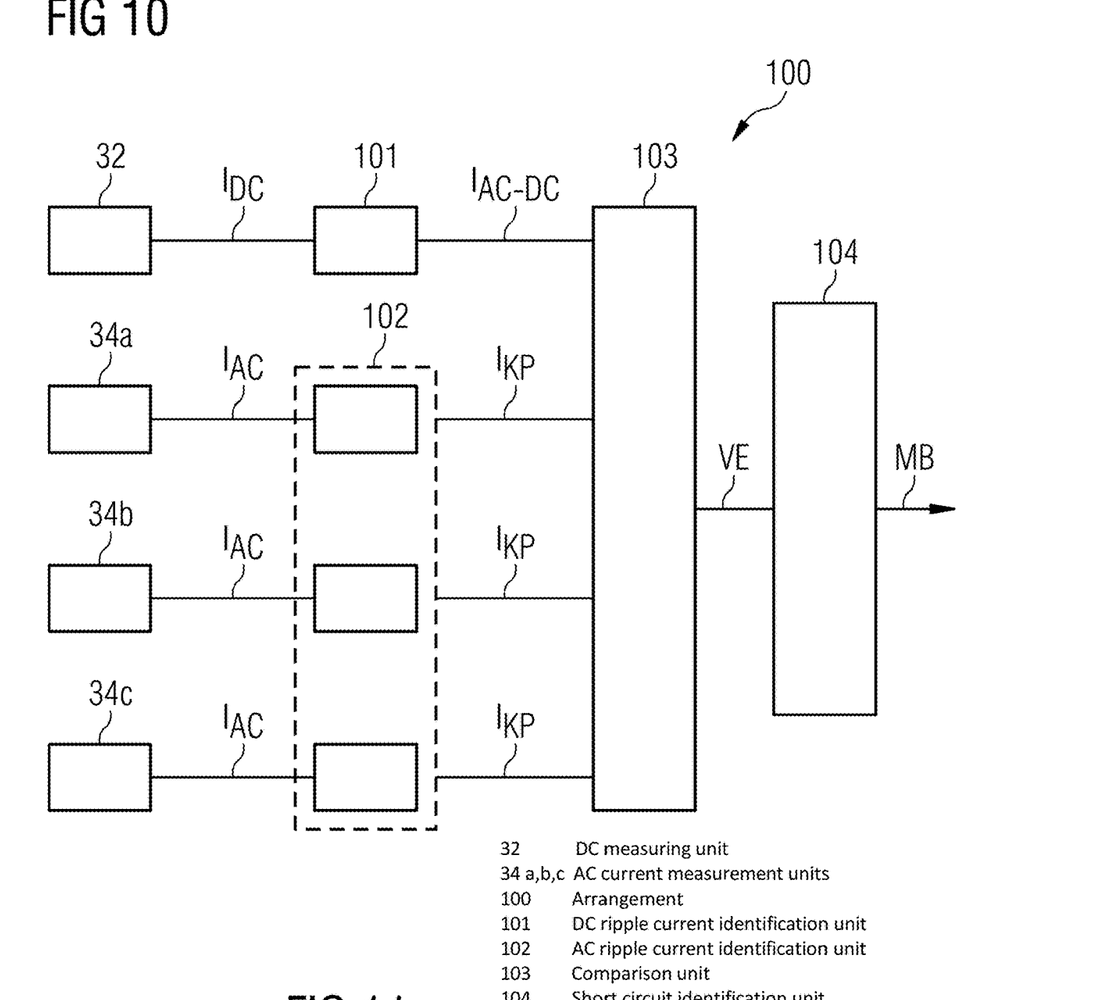
FIG. 10 depicts a schematic illustration of an example of an arrangement for identifying a phase-to-ground inverter short circuit.

FIG. 10 schematically illustrates an arrangement 100 for identifying a phase-to-ground inverter short circuit. The arrangement 100 has a DC measurement unit 32 for measuring DC current values $I_{DC}$. The DC measurement unit is located on that side of the IT network to which DC current is applied, as shown for example in FIG. 3. The measurement takes place at a frequency f that is higher than the clock frequency $f_T$ of the inverter 31 (see FIG. 3). Three AC current measurement units 34a, 34b, 34c are also part of the arrangement 100 shown in FIG. 10. The AC current measurement units 34a, 34b, 34c, as shown in FIG. 3, are arranged on that side of the IT network 30 to which three-phase current is applied. AC current values $I_{AC}$ of all three phases U, V, W are measured by the AC current measurement units 34a, 34b, 34c. The arrangement 100 furthermore has a DC ripple current identification unit 101. The DC ripple current identification unit 101 measures an AC component $I_{AC\text{-}DC}$ of the DC current sensor value $I_{DC}$. The ripple current identification unit 101 is furthermore used to identify whether this component is higher than a value predefined for regular operation.

An AC ripple current identification unit 102 is also part of the arrangement 100. The AC ripple current identification unit 102 identifies an AC short-circuit current $I_{KP}$ as a component of the three-phase current. The AC short-circuit current $I_{KP}$ is identified by subtracting the fundamental wave $I_G$ from the AC current sensor values $I_{AC}$. The fundamental wave is the regular sinusoidal wave that is generated by the inverter and that is offset by 120° in the different phases U, V, W. A comparison unit 103, which is connected downstream both of the DC ripple current identification unit 102 and of the AC ripple current identification unit 102, is also part of the arrangement 100. The comparison unit 103 compares a value of the AC short-circuit current $I_{KP}$ and a value of the AC component $I_{AC\_DC}$ of the DC current $I_{DC}$ and identifies a comparison result VE. Additionally, the arrangement 100 includes a short circuit identification unit 104. The short circuit identification unit 104 locates a short circuit on the basis of the identified comparison result VE. The short circuit is located in the phase for which the two values of the AC short-circuit current and the AC component of the DC current, that is to say the ripple currents, are approximately equal. "Approximately equal" in this connection is intended to mean that the amplitude of the smaller value of the ripple current reaches at least 50% of the larger value of the ripple current. This is because there are a few stray current paths through which the ripple current flows. The current therefore may never be equal through the two sensors. The arrangement 100 then outputs a modulation command MB to a modification unit 111, as shown in FIG. 11.

Figure 11:
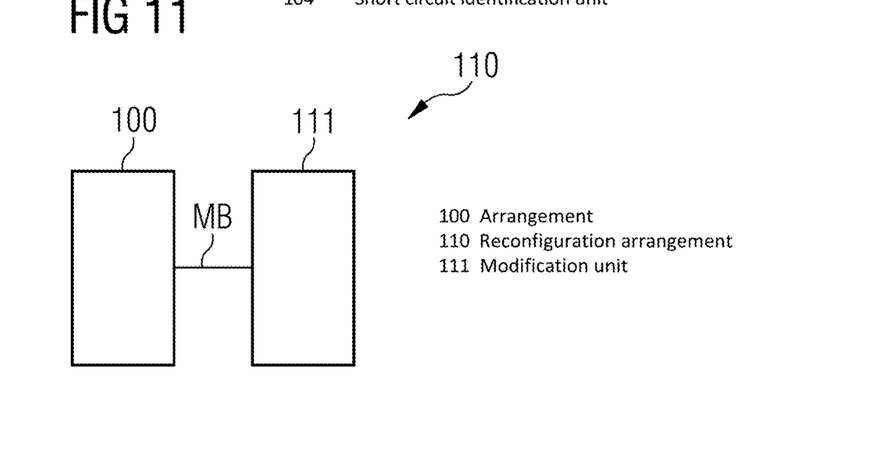
FIG. 11 depicts a schematic illustration of an example of a reconfiguration arrangement.

FIG. 11 shows a reconfiguration arrangement 110. The reconfiguration arrangement 110 includes the arrangement 100 shown in FIG. 10. The reconfiguration arrangement 110 furthermore includes a modification unit 111. The modification unit 111 serves to modify the modulation behavior of the inverter such that the AC short-circuit current is reduced. To this end, the modification unit 111 receives a corresponding modulation command MB from the arrangement 100. The modification is performed by changing the duty cycle of the pulse width modulation in order to drive the switches of the inverter of the IT network. This modification is explained in detail in connection with FIG. 6 to FIG. 8.

Finally, it is once again pointed out that the described methods and devices are merely exemplary embodiments, and that the disclosure may be varied by a person skilled in the art without departing from the field of the disclosure, insofar as this is specified by the claims. Other variations may be derived herefrom by the person skilled in the art, without departing from the scope of protection of the disclosure. It is therefore intended that the foregoing description be regarded as illustrative rather than limiting, and that it be understood that all equivalents and/or combinations of embodiments are intended to be included in this description.

For the sake of completeness, it is also pointed out that the use of the indefinite article "a" or "an" does not rule out the fact that the feature in question may also be present multiple times. Likewise, the term "unit" does not exclude this including a plurality of components that may possibly also be spatially distributed.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

The invention claimed is:

1. A method for identifying a phase-to-ground inverter short circuit in an isolé-terre (IT) network, the method comprising:
   measuring and evaluating alternating current (AC) current sensor values of all three phases and direct current (DC) current sensor values at a frequency that is higher than a clock frequency of an inverter;
   identifying an AC short-circuit current by subtracting a fundamental wave from the AC current sensor values;
   identifying an AC component of the DC current sensor value and identifying whether the AC component is higher than a value predefined for regular operation;
   comparing the AC short-circuit current and the AC component of the DC current sensor value; and
   identifying a short circuit for a phase for which two values of the AC short-circuit current and the AC component of the DC current sensor value are approximately equal.

2. The method of claim 1, further comprising:
   checking whether the frequency of the AC short-circuit current and the frequency of the AC component of the DC current sensor value are approximately equal.

3. The method of claim 2, wherein the IT network is monitored using an insulation monitor.

4. The method of claim 1, wherein the IT network is monitored using an insulation monitor.

5. The method of claim 1, further comprising:
   modifying a modulation of the inverter such that the AC short-circuit current is reduced.

6. The method of claim 5, wherein the modifying of the modulation of the inverter comprises actively locking a short-circuited phase to either DC+ potential or DC− potential.

7. The method of claim 6, wherein the modifying of the modulation of the inverter further comprises reducing the clock frequency of the inverter.

8. The method of claim 5, wherein the modifying of the modulation of the inverter comprises reducing the clock frequency of the inverter.

9. An arrangement for identifying a phase-to-ground inverter short circuit in an isolé-terre (IT) network, the arrangement comprising:
   at least three alternating current (AC) current measurement units for measuring and evaluating AC current sensor values of all three phases;
   at least one direct current (DC) measurement unit for measuring DC current sensor values at a frequency that is higher than a clock frequency of an inverter;
   a DC ripple current identification unit for identifying an AC component of the DC current sensor value and identifying whether the AC component is higher than a value predefined for regular operation;
   an AC ripple current identification unit for identifying an AC short-circuit current by subtracting a fundamental wave from the AC current sensor values;
   a comparison unit for comparing the AC short-circuit current and the AC component of the DC current sensor value; and
   a short circuit identification unit for identifying a short circuit for a phase for which two values of the AC short-circuit current and the AC component of the DC current sensor value are approximately equal.

10. The arrangement of claim 9, further comprising:
    a modification unit for modifying a modulation of the inverter such that the AC short-circuit current is reduced.

11. The arrangement of claim 10, wherein the modifying of the modulation of the inverter comprises actively locking a short-circuited phase to either DC+ potential or DC− potential.

12. The arrangement of claim 11, wherein the modifying of the modulation of the inverter further comprises reducing the clock frequency of the inverter.

13. The arrangement of claim 10, wherein the modifying of the modulation of the inverter comprises reducing the clock frequency of the inverter.

14. The arrangement of claim 9, further comprising:
    an insulation monitor configured to monitor the IT network.

15. The arrangement of claim 14, wherein the insulation monitor is configured to check whether the frequency of the AC short-circuit current and the frequency of the AC component of the DC current sensor value are approximately equal.

16. A non-transitory computer program product comprising a computer program configured to be loaded directly into a a non-transitory computer readable medium of a processor of an isolé-terre (IT) network, wherein the computer program, when executed by the processor, causes the IT network to:
   measure and evaluate alternating current (AC) current sensor values of all three phases and direct current (DC) current sensor values at a frequency that is higher than a clock frequency of an inverter;
   identify an AC short-circuit current by subtracting a fundamental wave from the AC current sensor values;
   identify an AC component of the DC current sensor value and identify whether the AC component is higher than a value predefined for regular operation;
   compare the AC short-circuit current and the AC component of the DC current sensor value; and
   identify a short circuit for a phase for which two values of the AC short-circuit current and the AC component of the DC current sensor value are approximately equal.

* * * * *